United States Patent
Segers et al.

(10) Patent No.: US 6,721,035 B1
(45) Date of Patent: Apr. 13, 2004

(54) LITHOGRAPHIC PROJECTION APPARATUS

(75) Inventors: Hubert M. Segers, 's Hertogenbosch (NL); Rudolf M. Boon, Eindhoven (NL); Anton A. Bijnagte, Tricht (NL); Fransiscus M. Jacobs, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/552,672

(22) Filed: Apr. 19, 2000

(30) Foreign Application Priority Data

Apr. 21, 1999 (EP) .............................. 99201223

(51) Int. Cl.⁷ ..................... G03B 27/42; G03B 27/52; G03B 27/58; G03B 27/60
(52) U.S. Cl. ..................... 355/53; 355/355; 355/30; 355/72; 355/73
(58) Field of Search ............................. 355/30, 53, 72, 355/73

(56) References Cited

U.S. PATENT DOCUMENTS

| | | | |
|---|---|---|---|
| 3,603,646 A | * 9/1971 | Leoff ............................ | 193/32 |
| 3,865,254 A | 2/1975 | Johannsmeier | |
| 4,720,732 A | * 1/1988 | Tsutsui ........................ | 355/30 |
| 5,471,279 A | * 11/1995 | Takizawa .................... | 269/21 |
| 5,972,110 A | 10/1999 | Akimoto | |
| 6,161,311 A | * 12/2000 | Doley et al. ................ | 118/715 |
| 6,228,544 B1 | * 5/2001 | Ota ............................... | 430/30 |

FOREIGN PATENT DOCUMENTS

| | | |
|---|---|---|
| JP | 10-266586 | 4/2000 |
| WO | WO 97/33205 | 9/1997 |
| WO | WO 98/28665 | 7/1998 |
| WO | WO 98/40791 | 9/1998 |

\* cited by examiner

*Primary Examiner*—Rodney Fuller
(74) *Attorney, Agent, or Firm*—Pillsbury & Winthrop LLP

(57) ABSTRACT

A lithographic projection apparatus includes a radiation system to supply a projection beam of radiation; a mask table provided with a mask holder to hold a mask; a substrate table provided with a substrate holder to hold a substrate; a projection system to image an irradiated portion of the mask onto a target portion of the substrate; and a preparatory station comprising an intermediate table on which a substrate can be positioned before transfer to the substrate table; the intermediate table including a major surface provided with a plurality of apertures, and gas bearing generator that generates a gas bearing between the major surface and a substrate located thereon.

29 Claims, 3 Drawing Sheets

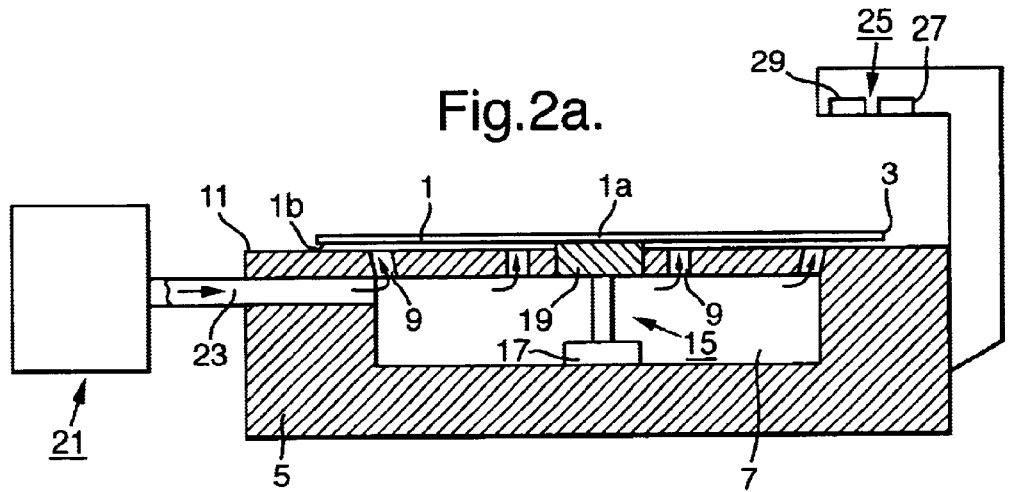
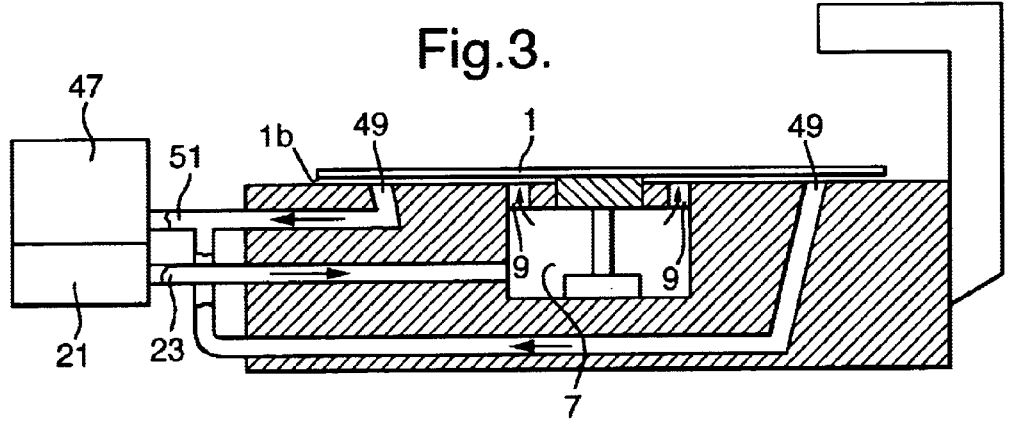
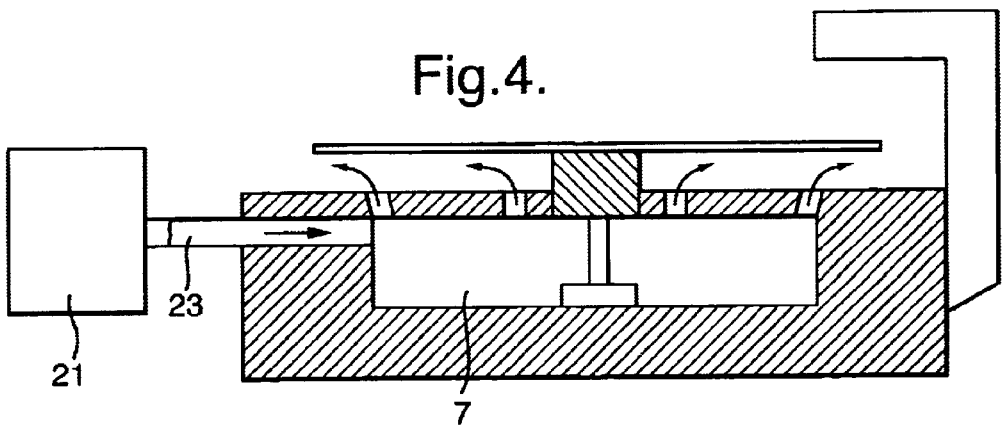

LITHOGRAPHIC PROJECTION APPARATUS

BACKGROUND OF THE INVENTION

The present invention relates to a preparatory station, in particular for a lithographic projection apparatus.

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die at once; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205, for example.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

Lithographic apparatus may employ various types of projection radiation, such as ultra-violet light (UV), extreme UV, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may be loosely referred to in this text, either singly or collectively, as a "lens". The apparatus may comprise components that are operated in vacuum, and are correspondingly vacuum-compatible. As mentioned in the previous paragraph, the apparatus may have more than one substrate table and/or mask table.

In a manufacturing process using a lithographic projection apparatus, a pattern in a mask is imaged onto a substrate which is at least partially covered by a layer of energy sensitive material (resist). For this process it is necessary to provide the substrate to the substrate table and to hold the substrate firmly in a fixed position on said table during the process. The substrate can be held in this fixed position with a substrate holder comprising means for applying a vacuum to a major surface of the substrate table. The vacuum will suck the substrate firmly to the substrate table. Before the substrate is provided to the substrate table it will often be processed (e.g. spincoated with resist) in a process track and therefore the temperature of the substrate can be different to the temperature of the substrate table. This temperature difference can give a problem, because the temperature of the substrate can change after the substrate is provided to the substrate table. The substrate table can cool the substrate, so that the substrate would tend to shrink. However, the substrate is held firmly by the substrate holder, which does not allow the substrate to shrink. The substrate can only shrink when the tension inside the substrate is higher than the friction between the substrate and the surface of the substrate table. If this occurs, a part of the substrate will slip over the surface of the substrate table to release the tension inside the substrate. This slip movement can give an error in the super-positioning of two concurrent images exposed on successive layers on the substrate, leading to so-called overlay errors. In general, the super-positioning of two concurrent images is very accurately achieved by aligning a mark on the substrate to a reference mark (e.g. on the mask, or on a fiducial on the substrate table). If the substrate slips after aligning the substrate to said reference mark, the super-positioning of two concurrent images on the slipped part of the substrate can fail. Similar considerations apply to the case whereby the substrate is colder than the substrate table and is warmed by the substrate table. The substrate in that case would like to expand and can also slip over the surface of the substrate table.

SUMMARY OF THE INVENTION

It is an object of the invention to alleviate, at least partially, the above problems. Accordingly the present invention provides an apparatus having an intermediate table comprising a major surface provided with a plurality of apertures, and gas bearing means for generating a gas bearing between said major surface and a substrate located thereon.

The gas bearing substantially removes the friction between the substrate and the major surface of the intermediate table. The substrate can easily expand and shrink on the gas bearing when the temperature of the substrate changes. Another advantage of using a gas bearing between the surface of the intermediate table and the substrate is that contamination of the backside of the substrate by foreign particles present on the major surface of the intermediate table is avoided. Particles already collected on the backside can even be blown away from the backside by the gas bearing.

The gas used in the gas bearing can be air and the gas source can be provided with a filter for the gas (e.g. air from outside) such that it is substantially free of foreign particles. Alternatively, other gases can be used, for example, nitrogen or helium. As will be appreciated by the skilled artisan, one can control the gas bearing by having apertures for the inflow of gas to the gas bearing and also apertures for the evacuation of gas from the gas bearing. A particular pressure for the inflow of gas may be between about 1.1 and 1.5 bar whereas a reduced gas pressure for the evacuation of the gas may be between about 0.5 and the 0.9 bar, for example. The gas bearing may have a thickness less than about 150 $\mu$m, for example.

The preparatory station can comprise a gas ionizer to ionize the gas used to create the gas bearing By using the gas ionizer the substrate can be gradually discharged from any initially charged state (since a statically charged part of the substrate will attract ions with an opposite charge, so that the charged part will be neutralized by the ions). This gradual discharging is advantageous, because it prevents a sudden discharge of the substrate, e.g. if it comes into the neighborhood of a conductor. A sudden discharge, for example with a spark, can cause damage to the substrate or to the sensitive structures already created thereon. As will be appreciated by one of ordinary skill in the art, the gas ionizer can, for example, employ radioactive ionization or corona discharge to ionize the gas; corona discharge in a method applying a high voltage to a sharp point to ionize the gas in the vicinity of the point.

The intermediate table can comprise a first controller to control the temperature of that table. By controlling temperature of the intermediate table, the temperature of the substrate can be influenced. A first possible mechanism for effecting such influence can be thermal radiation from the substrate to the intermediate table. A second mechanism can be that the temperature of the intermediate table influences the temperature of the gas used in the gas bearing, and the temperature of the gas influences the temperature of the substrate. Especially when the gap caused by the gas bearing between the substrate and the surface of the intermediate table is very thin, the temperature of said table can have a strong and rapid influence on the temperature of the substrate.

The preparatory station can comprise a second controller to regulate the temperature of the gas used in the gas bearing. By directly regulating the temperature of said gas, the temperature of the substrate can be influenced as well. Especially when the gap between the substrate and the intermediate table is large, it may be desirable to regulate the temperature of the gas directly instead of by regulating only the temperature of the intermediate table.

An advantage of the invention as described above is that said first and second controllers can maintain the intermediate table and the gas at a temperature substantially equal to the temperature of the substrate table (e.g. as measured using temperature sensing means in the substrate table). In that case the temperature of the gas and the intermediate table will change the temperature of the substrate to a temperature substantially equal to the temperature of the substrate table. After the substrate is provided to the substrate table the temperature of the substrate will not change significantly anymore, and therefore no substantial expansion or shrinkage of the substrate will occur on the substrate table. Accordingly, the chance that a slip of the substrate on the substrate table will occur can be minimized when these measures are taken.

In another embodiment according to the invention, the said preparatory station further comprises:
  a detectors constructed and arranged to detect a first position of said substrate on said intermediate table;
  a calculator constructed and arranged to calculate a required displacement between said first position and a desired position of the substrate on the intermediate table; and
  an actuator constructed and arrange to move said substrate from said first position to said desired position.

The detector can comprise an edge detector for detecting the position of the edge of said substrate on said intermediate table. The detector can comprise capacitive sensors or optical sensors, e.g. a camera system or a CCD array. The information obtained with the detector about the first position of the substrate on the intermediate table, together with information regarding the desired position of the object on the table, can be processed in the calculator so as to calculate the required displacement. Said desired position of the substrate on the intermediate table can be determined beforehand and stored in a memory device, wherefrom it can be retrieved when necessary. The actuator can comprise, for example, a robot arm.

The substrate can be brought into the desired position and to a certain temperature simultaneously. This improves the time efficiency of the apparatus (throughput-enhancement). Another advantage is that the accuracy with which the detector can detect the first position of the substrate on the intermediate table is better, because the substrate is perfectly flat on the gas bearing. This is because the gas bearing exerts a force on the substrate that is equally divided over the total backside of the substrate, so that the substrates is not stressed (and thus bent or warped) by the substrate holder.

The invention also relates to a device manufacturing method comprising:
  providing substrate to an intermediate table comprising a major surface provided with a plurality of apertures, and maintaining the substrate for a given time interval upon a gas bearing generated between the major surface and the substrate. Detaining the substrate on the gas bearing in this manner allows the substrate to shrink or expand when its temperature changes without tension arising between the substrate and the intermediate table.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an-array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The invention as explained hereabove may also be applied to a preparatory station for preparing a mask.

Although specific reference has been made to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its advantages will be further elucidated with the aid of exemplary embodiments and the accompanying schematic drawings, whereby:

FIG. 2a shows a cross sectional view of a part of a preparatory station according to the invention (in elevation);

FIG. 2c is a plan view of the subject of FIG. 2a;

FIG. 3 shows a third embodiment of a preparatory station according to the invention;

FIG. 4 shows a fourth embodiment of a preparatory station according to the invention.

DETAILED DESCRIPTION OF THE EMBODIMENTS

Embodiment 1

Figure 1:
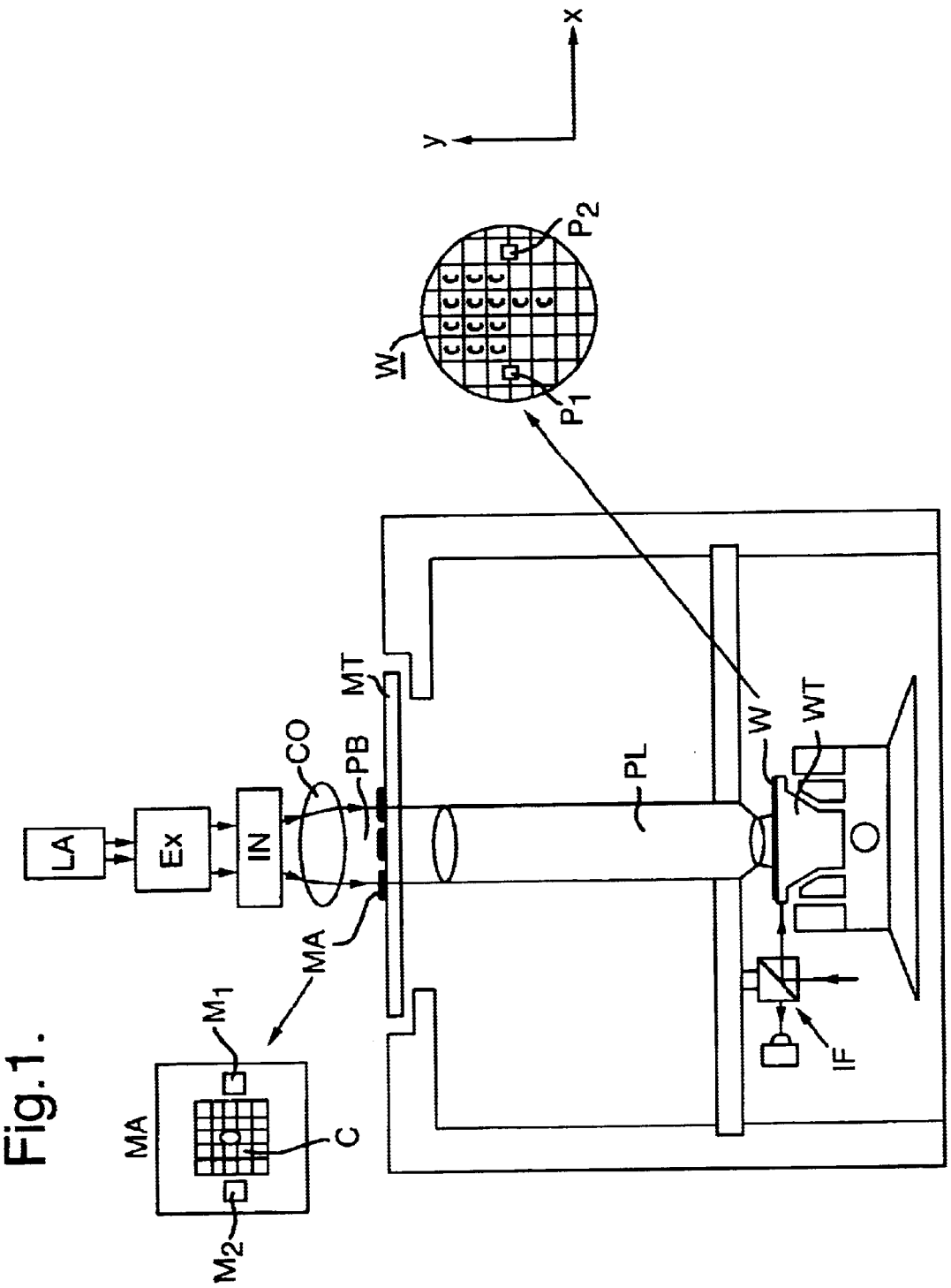
FIG. 1 schematically depicts a lithographic projection apparatus suitable for use with the invention.

FIG. 1 schematically depicts a lithographic projection apparatus according to the invention. The apparatus includes:
- a radiation system LA, Ex, IN, CO for supplying a projection beam PB of radiation, such as ultraviolet light (e.g. at a wavelength of 365 nm, 248 nm, 193 nm or 157 nm), EUV, X-rays, electrons or ions;
- a mask table MT provided with a mask holder for holding a mask MA (e.g. a reticle);
- a substrate table WT provided with a substrate holder for holding a substrate W (e.g. a resist-coated silicon wafer);
- a projection system PL (e.g. a lens or catadioptric system, a mirror group or an array of field deflectors) for imaging an irradiated portion of the mask MA onto a target portion C (die) of the substrate W.

As here depicted, the apparatus includes refractive components. However, it may alternatively comprise one or more reflective components.

The radiation system comprises a source LA (e.g. a Hg lamp or excimer laser, a thermionic gun or ion source, or a wiggler/undulator situated around the path of an electron beam in a storage ring or synchrotron) which produces a beam of radiation. This beam is passed along various optical components,—e.g. beam shaping optics Ex, an integrator IN and a condensor CO—so that the resultant beam PB has a desired shape and intensity distribution in its cross-section.

The beam PB subsequently intercepts the mask MA which is held in the mask holder on the mask table MT. Having passed through the mask MA, the beam PB passes through the projection system PL, which focuses the beam PB onto a target area C of the substrate W. With the aid of the interferometer AF, the substrate table WT can be moved accurately, e.g. so as to position different target areas C in the path of the beam PB. Similarly, the mask table MT can be positioned very accurately with respect to the beam PB. In general, movement of the mask table MT and the substrate table WT will be realized with the aid of a long stroke module (coarse positioning) and a short stroke module (fine positioning), which are not explicitly depicted in FIG. 1. In the case of a waferstepper, as opposed to a step-and-scan device, the mask table MT may only be moved with a short stroke module, or may be just fixed.

The depicted apparatus can be used in two different modes:
- In step mode, the mask table MT is kept essentially stationary, and an entire mask image is projected at once (i.e. a single "flash") onto a target area C. The substrate table WT is then shifted in the X and/or Y directions so that a different target area C can be irradiated by the (stationary) beam PB;
- In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT, is simultaneously moved in the same or opposite direction at a speed V=Mv, in which M is the magnification of the projection system PL (typically, M=¼ or ⅕). In this manner, a relatively large target area C can be exposed, without having to compromise on resolution.

Embodiment 2

FIG. 2a shows a cross-sectional view of a preferred embodiment of a preparatory station according to the invention. From the figure the following items can be seen;
- a substrate (wafer) 1 having an edge 3, a front side 1a and a backside 1b;
- an intermediate table 5 comprising a gas chamber 7 connected via apertures 9 to a major surface 11;
- a rotation unit 15 comprising an actuator 17 and vacuum holder 19 for holding and rotating the substrate 1 above the intermediate table 5;
- gas bearing comprising a gas source 21 for supplying a gas to the major surface 11 via the apertures 9, the gas chamber 7 and a tube 23;
- detector 25 comprising edge detector 27 for detecting the edge 3 of the substrate 1 and mark detector 29 for detecting a mark on the front side 1a of the substrate 1.

The substrate 1 will be moved to the intermediate table 5 by a substrate transporter, e.g. a robot arm. In general, the substrate is held on the backside 1b or the edge 3 by the substrate transporter, because on the front side 1a sensitive structures already created on the substrate 1 can be present. The substrate transporter will hold the substrate 1 above the major surface 11, and the vacuum holder 19 will be moved by the actuator 17 toward that surface 11 up to the backside 1b in a direction perpendicular thereto. A vacuum is applied to the vacuum holder 19, such that the backside 1b of the substrate 1 is sucked to the vacuum holder 19. The substrate transporter is then released from the backside 1b of the substrate 1 and moved away from the major surface 11. The actuator 17 retracts the holder 19 towards the major surface 11 in a direction substantially perpendicular to that surface 11, and gas is supplied to that surface 11 by the gas source 21 via the tube 23, the gas chamber 7 and the aperatures 9. The gas creates a gas bearing between the substrate 1 and the major surface 11.

Figure 2B:
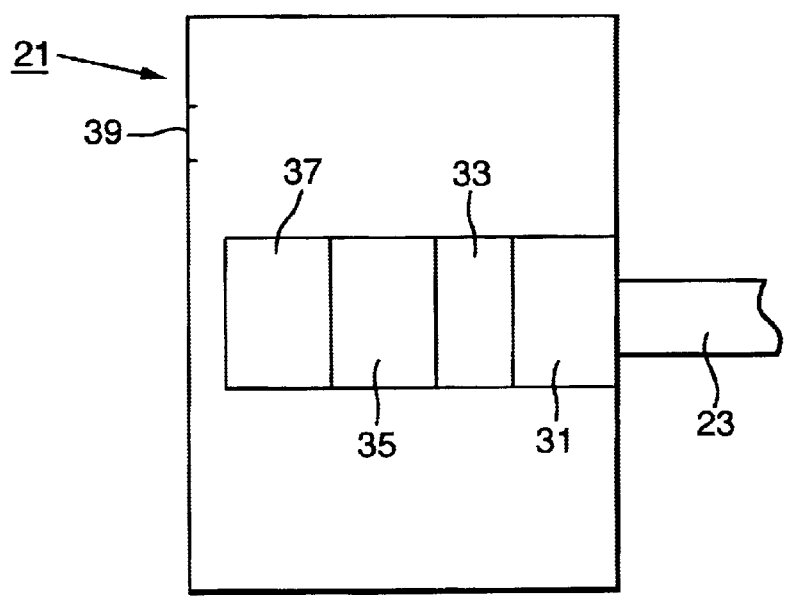
FIG. 2b shows a cross sectional view of a gas source as can be applied in a preparatory station according to the invention.

As shown in FIG. 2b the gas source 21 can comprise a pump 31, gas ionizer 33, second controller 35 for temperature control of the gas, gas filter 37 and an air inlet 39. If the gas bearing is created with air, the air will enter the gas source 21 through the air inlet 39 and will be filtered by gas filter 37 so as to make the air substantially free of foreign particles. Thereafter the air will be brought to a required temperature by second controller 35, ionized by ionizer 33, brought to a required pressure by pump 31 and delivered through the tube 23 to the intermediate table 5. If a gas other than air is used the filter 37 and the inlet 39 maybe absent. Gases such as nitrogen and helium can be used for this purpose. The gas ionizer 33 ionizes the gas used to create the gas bearing. The ions in the gas will be attracted by any static charge collected on the backside 1b of the substrate 1, and will neutralize such charge.

The intermediate table 5 (FIG. 2a) can comprise first controller for controlling the temperature of that table. By controlling the temperature of the intermediate table 5, the temperature of the substrate 1 can be influenced. A first possible mechanism for effecting this influence can be thermal radiation between the substrate 1 and the surface 11. A second mechanism can be that the temperature of the intermediate table 5 influences the temperature of the gas used in the gas bearing, and the temperature of the gas influences the temperature of the substrate 1. Especially when the gap caused by the gas bearing between the substrate 1 and the surface 11 is thin, for example, less than 150 μm, the temperature of said table 5 can have a strong and rapid influence on the temperature of the substrate 1.

It will be advantageous if said first and/or said second controller maintain the intermediate table 5 and the gas at a temperature substantially equal to the temperature of the substrate table WT. One could, for example, employ a sensor for measuring the temperature of the substrate table WT and one could regulate the temperature in the first and/or second controller such that it is substantially equal to said measured temperature. This gives an advantage because the temperature of the substrate 1 before transfer to the substrate table WT will be made equal to the temperate of the substrate table WT, and therefore substantially no shrinkage or expansion will occur after placement of the substrate 1 upon the substrate table WT.

Figure 2C:
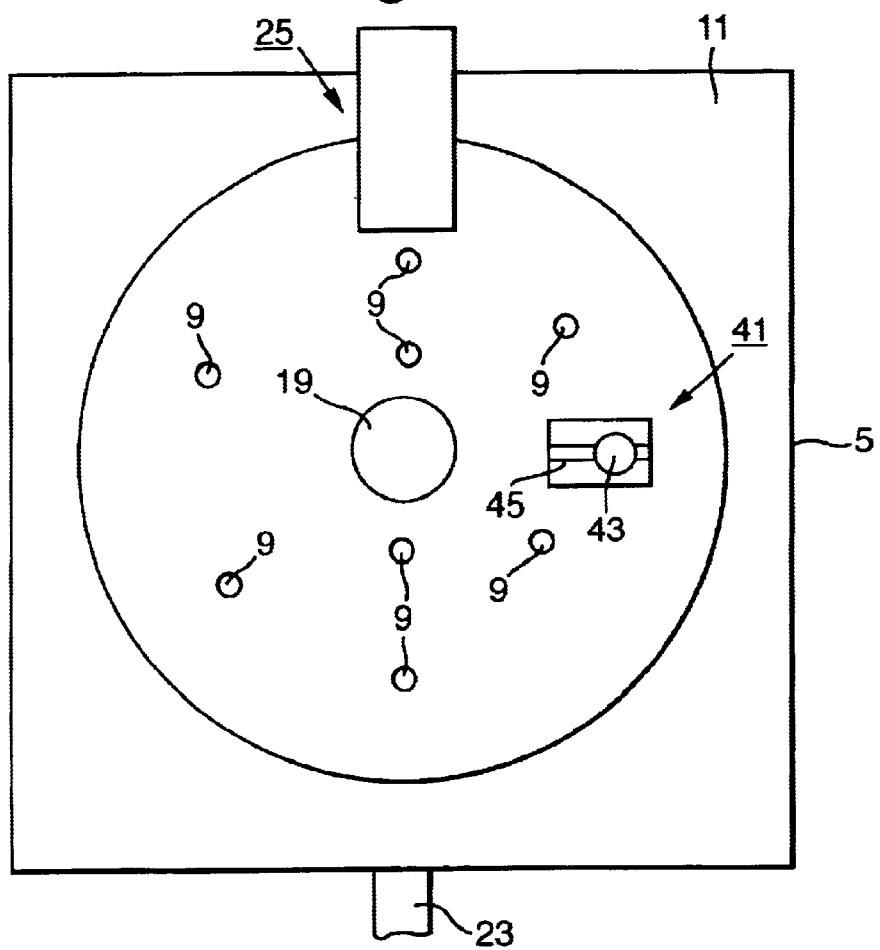

In measuring the orientation of the substrate 1 on the intermediate table 5 the mark detector 29 can be used to detect a mark on the front side of the substrate 1a, and/or the edge detector 27 can be used to detect the edge 3 of the substrate 1. The edge detector 27 measures the eccentricity of the substrate 1 on the intermediate table 5. This is accomplished by the actuator 17 which rotates the vacuum holder 19 around an axis perpendicular to the plane of the intermediate table such that the edge 3 of the substrate 1 rotates underneath the edge detector 27 (see FIG. 2c, which shows a plan view of the intermediate table 5 without a substrate positioned thereon). The edge detector 27 can employ a capacitive sensor or an optical sensor (e.g. a camera system or a CCD array) to measure the position of the edge 3 of the substrate 1. In this way:

The notch or flat edge can be automatically oriented as desired, before the substrate 1 is transferred to the substrate table WT.

It can be determined if the eccentricity of the substrate 1 upon the table 5 exceeds a threshold value which, when translated to the substrate table WT, would cause the substrate 1 to fail outside the capture range of the alignment module employed at the substrate table WT.

If the first position of the substrate 1 on the intermediate table 5 is not within the capture range of the alignment module employed at the substrate table WT, one would like to reposition the substrate 1 upon the intermediate table 5, because otherwise the substrate 1 can not be accurately transferred to the required position on the substrate table WT for exposure. For this repositioning the intermediate table 5 is provided with a moveable portion 41 comprising second vacuum holder 43 which can be sucked against the backside 1b of the substrate 1, and a displace 45 for moving said second holder 43. If the substrate 1 is not in the desired in-plane position on the intermediate table 5 the substrate 1 on the intermediate table will be rotated such that the center of the substrate 1 and the center of the holder 19 will be in one straight line with the moveable portion 41. Subsequently, the second holder 43 will be sucked to the backside 1b of the substrate 1 and the vacuum in the holder 19 will be released. The second holder 43 will be moved by the displace 45, to or away from the center of the holder 19, such that after release of the vacuum in the second holder 43, the substrate 1 will have the required in-plane position. In said required position the center of the substrate 1 will be substantially at the same position as the center of the holder 19. If necessary more than one moveable portion 41 can be used.

Embodiment 3

FIG. 3 shows a third embodiment of the invention in cross section. The gas source 21 delivers gas through the tube 23, the gas chamber 7 and the apertures 9 to the gas bearing. The gas in the gas bearing will be evacuated through the evacuation apertures 49 and the evacuation tube 51 to an evacuation pump 47. Any foreign particles present on the backside 1b of the substrate 1 can be evacuated to the evacuation pump 47 in this embodiment. If the evacuation pump were not present, foreign particles could be blown off the backside of the substrate 1 into the apparatus, where the foreign particles could cause contamination problems. Another advantage of evacuating the gas is that it is easier to control the thickness of the gas bearing if the inflow and the evacuation of gas are controlled, as the skilled artisan will appreciate. The evacuated gas can be returned to the gas source 21, such that after filtering it can be reused in the gas bearing.

Embodiment 4

FIG. 4 shows a fourth embodiment of the invention in cross section. In this embodiment the gas bearing is relatively thick (i.e. larger than 150 μm). Gas will be supplied to the gas bearing from the gas source 21 through the tube 23, the gas chamber 7 and the apertures 9. If such a gas bearing is used the gas source 21 will advantageously be equipped with a second controller for directly controlling the temperature of said gas.

What is claimed is:

1. A lithographic projection apparatus, comprising:
   a radiation system constructed and arranged to supply a projection beam of radiation;
   a mask table provided with a mask holder constructed and arranged to hold a substrate;
   a substrate table provided with a substrate holder constructed and arranged to hold a substrate;
   a projection system constructed and arranged to image an irradiated portion of the mask onto a target portion of the substrate;
   a preparatory station comprising an intermediate table on which a substrate can be positioned before transfer to the substrate table,
   the intermediate table comprising a major surface provided with a plurality of aperatures; and
   a gas bearing generator constructed and arranged to generate a gas bearing between said major surface and a substrate located thereon.

2. An apparatus according to claim 1, wherein said preparatory station comprises a gas ionizer constructed and arranged to ionize said gas.

3. An apparatus according to claim 1 wherein said intermediate table comprises a first temperature controller constructed and arranged to regulate temperature of the intermediate table.

4. An apparatus according to claim 3 wherein said first temperature controller maintains the intermediate table and the gas at a temperature substantially equal to a temperature of the substrate table.

5. An apparatus according to claim 1, wherein said gas bearing has a thickness less than 150 μm.

6. An apparatus according to claim 1 wherein said preparatory station comprises a temperature controller constructed and arranged to regulate a temperature of said gas.

7. An apparatus according to claim 1 wherein said apparatus further comprises:
- a position detector constructed and arranged to detect a first position of said substrate on said intermediate table;
- a displacement calculator for calculating a required displacement between said first position and a desired position of the substrate on the intermediate table; and
- an actuator constructed arranged to move said substrate from said first position to said desired position.

8. An apparatus according to claim 7, wherein said position detector is constructed and arranged to detect an edge of the substrate.

9. An apparatus according to claim 7 wherein said position detector is constructed and arranged to detect a mark on the substrate.

10. An apparatus according to claim 7, wherein said gas bearing generator comprises:
- a gas source arranged to deliver gas through the aperatures to generate the gas bearing, and
- an evacuation pump arranged to evacuate the gas from the gas bearing.

11. A device manufacturing method comprising:
(a) providing a mask table with a substrate which contains a pattern,
(b) providing a substrate table with a substrate which is at least partially covered by a layer of radiation-sensitive material,
(c) prior to (b), providing the substrate to an intermediate table comprising a major surface provided with a plurality of aperatures, and maintaining the substrate for a given time interval upon a gas bearing generated between the major surface and the substrate; and
(d) using a projection beam of radiation to project an irradiated part of the mask onto a target area of the layer of radiation-sensitive material.

12. A device manufactured in accordance with a method as claimed in claim 11.

13. A device manufacturing method according to claim 11, further comprising:
ionizing said gas bearing with a gas ionizer.

14. A device manufacturing method according to claim 11, further comprising:
regulating a temperature of said intermediate table with a first temperature controller.

15. A device manufacturing method according to claim 11, further comprising:
regulating a temperature of said gas bearing with a second temperature controller.

16. A device manufacturing method according to claim 11, further comprising:
maintaining said intermediate table and the gas bearing at a temperature substantially equal to a temperature of the substrate table.

17. A device manufacturing method according to claim 11, further comprising:
- detecting a first position of said substrate on said intermediate table;
- calculating a required displacement between said first position and a desired position of the substrate on the intermediate table; and
- moving said substrate from said first position to said desired position.

18. A device manufacturing method according to claim 11, further comprising:
- generating the gas bearing by delivering gas through said plurality of aperatures; and
- evacuating said gas with a gas pump.

19. A substrate preparing device comprising an intermediate table on which a substrate can be positioned before transfer to a substrate table in a lithographic projection apparatus;
the intermediate able comprising a major surface provided with a plurality of aperatures, and a gas bearing generator constructed and arranged to generate a gas bearing between said major surface and a substrate located thereon;
a first temperature controller constructed and arranged to regulate a temperature of the intermediate table; and
an ionizer constructed and arranged to ionize the gas.

20. A substrate preparing device according to claim 19, wherein said gas bearing generator comprises:
- a gas source arranged to deliver gas through the aperatures to generate the gas bearing, and
- an evacuation pump arranged to evacuate the gas from the gas bearing.

21. A substrate preparing device according to claim 19, wherein said first temperature controller maintains the intermediate table and the gas bearing at a temperature substantially equal to a temperature of the substrate table.

22. A substrate preparing device according to claim 19, wherein said intermediate table further comprises a second temperature controller constructed and arranged to regulate a temperature of said gas bearing.

23. A substrate preparing device according to claim 19, further comprising:
- a position detector constructed and arranged to detect a first position of said substrate on said intermediate table;
- a displacement calculator constructed and arranged to calculate a required displacement between said first position and a desired position of the substrate on the intermediate table; and
- an actuator constructed and arranged to move said substrate from said first position to said desired position.

24. A substrate preparing device according to claim 19, wherein said substrate preparing device is a part of a resist processing apparatus.

25. A substrate preparing device comprising:
an intermediate table on which a substrate can be positioned before transfer to a substrate table in a lithographic projection apparatus, the intermediate table comprising a major surface provided with a plurality of apertures;

a gas bearing generator constructed and arranged to generate a gas bearing between said major surface and a substrate located thereon; and a temperature controller constructed and arranged to regulate a temperature of at least one of the intermediate table and the temperature of the gas.

26. A substrate preparing device according to claim 25, further comprising:

a gas ionizer constructed and arranged to ionize said gas bearing.

27. A substrate preparing device according to claim 25, further comprising:

a position detector constructed and arranged to detect a first position of said substrate on said intermediate table;

a displacement calculator constructed and arranged to calculate a required displacement between said first position and a desired position of the substrate on the intermediate table; and an actuator constructed and arranged to move said substrate from said first position to said desired position.

28. A substrate preparing device according to claim 25, wherein said gas bearing generator comprises:

a gas source arranged to deliver gas through said plurality of apertures to generate the gas bearing; and an evacuation pump arranged to evacuate the gas from the gas bearing.

29. A substrate preparing device according to claim 25, wherein said substrate preparing device is a part of a resist process apparatus.

\* \* \* \* \*